(12) United States Patent
Watanabe et al.

(10) Patent No.: US 9,669,493 B2
(45) Date of Patent: Jun. 6, 2017

(54) LAYERED SOLDER MATERIAL FOR BONDING DIFFERENT SPECIES OF ELECTRODES AND METHOD OF BONDING THE DIFFERENT SPECIES OF ELECTRODES IN AN ELECTRONIC COMPONENT

(71) Applicant: Senju Metal Industry Co., Ltd., Tokyo (JP)

(72) Inventors: Koji Watanabe, Tochigi-ken (JP); Minoru Toyoda, Tochigi-ken (JP); Satoshi Tomita, Tochigi-ken (JP); Tsutomu Sugino, Tochigi-ken (JP); Daichi Kikuchi, Tochigi-ken (JP); Hiroki Oshima, Tochigi-ken (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/648,031

(22) PCT Filed: Nov. 18, 2013

(86) PCT No.: PCT/JP2013/081044
§ 371 (c)(1),
(2) Date: May 28, 2015

(87) PCT Pub. No.: WO2014/084080
PCT Pub. Date: Jun. 5, 2014

(65) Prior Publication Data
US 2015/0314396 A1    Nov. 5, 2015

(30) Foreign Application Priority Data

Nov. 30, 2012  (JP) ................ 2012-263103

(51) Int. Cl.
| | | |
|---|---|---|
| *B23K 35/00* | (2006.01) |
| *B23K 35/14* | (2006.01) |
| *B23K 35/02* | (2006.01) |
| *B23K 35/28* | (2006.01) |
| *B23K 1/00* | (2006.01) |
| *B23K 1/19* | (2006.01) |
| *C22C 12/00* | (2006.01) |
| *B32B 15/01* | (2006.01) |
| *B23K 35/26* | (2006.01) |
| *B23K 35/40* | (2006.01) |
| *C22C 1/00* | (2006.01) |
| *C22C 11/06* | (2006.01) |
| *C22C 13/00* | (2006.01) |

(Continued)

(52) U.S. Cl.
CPC ........ *B23K 35/0238* (2013.01); *B23K 1/0016* (2013.01); *B23K 1/19* (2013.01); *B23K 35/0222* (2013.01); *B23K 35/0233* (2013.01); *B23K 35/26* (2013.01); *B23K 35/262* (2013.01); *B23K 35/268* (2013.01); *B23K 35/28* (2013.01); *B23K 35/40* (2013.01); *B32B 15/01* (2013.01); *B32B 15/018* (2013.01); *C22C 1/00* (2013.01); *C22C 11/06* (2013.01); *C22C 12/00* (2013.01); *C22C 13/00* (2013.01); *C22C 13/02* (2013.01); *C22C 21/14* (2013.01); *H05K 3/3463* (2013.01); *B23K 2201/42* (2013.01); *H05K 2201/10992* (2013.01); *H05K 2203/0405* (2013.01); *H05K 2203/12* (2013.01); *Y10T 428/12986* (2015.01)

(58) Field of Classification Search
CPC ....... H01L 2224/05611; H01L 2224/03; H01L 2224/11; H01L 24/11; H01L 21/4857; B23K 35/262; B23K 1/0016; B23K 1/19; B23K 35/302; H05K 2201/10992; H05K 3/3436; H05K 3/3463; H05K 1/09; H05K 1/112; H05K 3/244; H05K 3/4644
USPC .... 228/101, 180.1, 180.21, 208, 248.1, 56.3
See application file for complete search history.

(56) References Cited

U.S. PATENT DOCUMENTS

| 5,731,066 A * | 3/1998 | Ando ................. B23K 1/0016 174/263 |
| 2006/0067853 A1 | 3/2006 | Takahashi et al. |
| 2012/0112201 A1 | 5/2012 | Otsuka et al. |

FOREIGN PATENT DOCUMENTS

| CH | 1509499 A | 6/2004 |
| JP | 11-226775 A | 8/1999 |

(Continued)

OTHER PUBLICATIONS

JP11226775 computer english translation Feb. 16, 2016.*

(Continued)

*Primary Examiner* — Erin Saad
(74) *Attorney, Agent, or Firm* — Chernoff, Vilhauer, McClung & Stenzel, LLP

(57) ABSTRACT

When soldering a package having an electrode on which Ni/Au or Ag—Pd alloy is plated, to a printed circuit board having a Cu electrode or an electrode on which Cu is plated, a solid-phase diffusion layer is formed within a layered solder material for bonding different species of electrodes. The layered solder material is composed of a solder material of Sn—Ag—Cu series or Sn—Sb series and a solder material of Sn—Ag—Cu—Ni series or Sn—Pb series. The electrode on which Ni/Au or Ag—Pd alloy is plated and the Cu electrode or the electrode on which Cu is plated are soldered with the solder material of Sn—Ag—Cu series or Sn—Sb series being attached to the Cu electrode and the solder material of Sn—Ag—Cu—Ni series or Sn—Cu series being attached to the electrode on which Ni/Au or Ag—Pd alloy is plated. This restrains formation of intermetallic compounds and provides high bonding reliability.

10 Claims, No Drawings

(51) Int. Cl.
    *C22C 13/02*    (2006.01)
    *C22C 21/14*    (2006.01)
    *H05K 3/34*    (2006.01)
    *B23K 101/42*    (2006.01)

(56) References Cited

FOREIGN PATENT DOCUMENTS

| | | |
|---|---|---|
| JP | 2000-015479 A | 1/2000 |
| JP | 2004-188482 A | 7/2004 |
| JP | 2005-014024 A | 1/2005 |
| JP | 2006-088204 A | 4/2006 |
| JP | 2006-131979 A | 5/2006 |
| JP | 2013-035046 A | 2/2013 |
| TW | 201230102 A | 7/2012 |

OTHER PUBLICATIONS

Extended European Search Report prepared by the European Patent Office for EP 13859516.0; dated Jul. 5, 2016, 9 pages.
International Search Report from priority PCT Application No. PCT/JP2013/081044, mailed Feb. 18, 2014, 5 pgs.
Taiwan Patent Office, First Examination Report dated Dec. 27, 2016, in corresponding Taiwanese Patent Application No. TW 102142597, 6 pages.

\* cited by examiner

LAYERED SOLDER MATERIAL FOR BONDING DIFFERENT SPECIES OF ELECTRODES AND METHOD OF BONDING THE DIFFERENT SPECIES OF ELECTRODES IN AN ELECTRONIC COMPONENT

TECHNICAL FIELD

The present invention relates to the layered solder material for bonding different species of electrodes and the method of bonding the different species of electrodes in an electronic component.

BACKGROUND

It has been generally performed in past in order to still more cope with downsizing and high functionality of an electronic component such as a cellular phone and a digital camera that a package has bumps (bump electrodes) formed by solder balls or solder paste on its elementary surface and any reflow processing then performed to a printed circuit board enables the package to be bonded to the printed circuit board.

A composition of plating used for electrodes of the package and a composition of plating used for electrodes of the printed circuit board have been determined by taking into consideration any reasons of design and any costs. Accordingly, the composition of plating used for the electrodes of the package and the composition of plating used for the electrodes of the printed circuit board may be different from each other. For example, there has been a case where a package having an electrode on which Ni/Au is plated is bonded to the printed circuit board having a Cu electrode or an electrode on which Cu is plated (hereinafter, merely referred to as "Cu electrode") using an alloy of Sn—Ag—Cu series (as one example thereof, Sn-3.0Ag-0.5Cu, hereinafter, briefly referred to as "SAC alloy") now generally used as Pb-free solder, or a case where a package having an electrode on which Ag—Pd alloy is plated is bonded to the printed circuit board having the Cu electrode using the SAC alloy. As the composition of plating other than those, Ag, Ni, and Ni—P have been also known.

Optimization of the composition of solder alloy, flux, soldering condition and the like, respectively has been known as a conventional way to improve any solderability and/or bonding strength thereof. In addition, a way to consider a composition of plating on an electrode to be soldered has also been known. Patent documents 1 and 2 disclose an invention to consider a composition of plating on an electrode, particularly an electrode on which electroless Ni plating is performed.

DOCUMENT FOR PRIOR ART

Patent Documents

Patent Document 1: Japanese Patent Application Publication No.2000-015479
Patent Document 2: Japanese Kohyou Application Publication No.2006-131979

SUMMARY OF THE INVENTION

Problem to Be Solved by the Invention

When soldering two electrodes made of different materials, any fluidity may occur within the solder when melting it. An element of plating for one electrode transfers and/or diffuses to a side of the other electrode so that intermetallic compounds may be formed on bonded interfaces thereof.

Generally, the bonding strength and heat cycle resistant characteristics have patterns to deteriorate on the basis of increase of species of the intermetallic compounds in the bonded interface. Further, as described above, the electrode of electronic component has been downsized or has been made small-sized together with the further down-sizing of the electronic component. Thus, when the species of the intermetallic compounds are increased in the bonded interface of the downsized or small-sized electrodes, a serious problem may occurs where these bonded electrodes are broken to lose a function of the electronic component by any impact load when, for example, accidentally dropping the electronic component. Therefore, the few species of the intermetallic compounds formed in the bonded interface of the electrodes are desirable. It is an important technical matter to perform a control so as to restrain the species of the intermetallic compounds from being increased. The following will describe formation examples of the intermetallic compounds.

For example, when the package having the electrode on which Ni/Au is plated is bonded to the printed circuit board having the Cu electrode using the SAC alloy, the intermetallic compounds of Ni—Sn are formed on an interface between Ni/Au plating film and the SAC alloy. However, when bonding it to the printed circuit board, Cu diffuses from the Cu electrode of the printed circuit board to a side of the package and an intermetallic compounds, $(Cu, Ni)_6Sn_5$ of Ni—Sn—Cu are also formed.

Further, when the package having an electrode on which Ag—Pd alloy is plated is bonded to the printed circuit board having the Cu electrode using the SAC alloy, Pd is subject to diffusion from the electrode of the package to Sn and diffuses to the Cu electrode of the printed circuit board to help forming the intermetallic compounds. Cu also diffuses from the Cu electrode of the printed circuit board so that the intermetallic compounds are subject to any formation on the interface of the electrode of the package.

The patent documents 1 and 2 disclose solders used when forming solder bumps on electrodes of a BGA substrate on which electroless Ni plating is performed. They, however, do not consider any problems generating when bonding the formed solder bumps to the BGA substrate, In other words, although the electrodes of BGA substrate side are generally often the Cu electrodes or the electrodes on which Cu is plated, the patent documents 1 and 2 disclose merely that the solder bumps are bonded to the electrodes of BGA substrate using a single species of solder. Accordingly, the inventions disclosed in the patent documents 1 and 2 cannot solve the above-mentioned problem, namely, when soldering two electrodes made of different species, the bonding strength and heat cycle resistant characteristics deteriorate on the basis of formation of the intermetallic compounds in the bonded interface thereof.

Moreover, it is technically difficult to select any optimal solder composition for each of the electrodes and print two species of solder pastes with laying one solder paste on another. In addition, it takes too much operation time to print solder paste and mount any solder materials thereon by a mounter or the like, or in contrast thereof, to apply flux, to mount the solder materials thereon and to apply the solder paste thereto. Therefore, it has no option but to select a single species of solder composition which can obtain any suitable strength by taking into consideration strength of the bonded interface and strength of the solder materials.

This invention solves these problems and presents layered solder material for bonding different species of electrodes and a method of bonding the different species of electrodes in an electronic component, by which two electrodes made of different species of materials, specifically, two species of electrodes on which different species of plating are performed, for example, the electrode on which Ni/Au or Ag—Pd alloy is plated and the Cu electrode, can be bonded with high bonding reliability by restraining any intermetallic compounds from being formed on the bonded interfaces.

Means for Solving the Problems

The inventors have found out the following items (i) through (iii), as a result of keen examinations to solve the above-mentioned problems, and have completed the invention.

(i) The layered solder material is formed by contacting to each other a first layer of solder material obtained by selecting at least one species of element from a group of elements consisting of Sn, Ag, Cu, Ni, Sb, Bi, Ge, Al, Ga, In, Zn, Au, Pd, Pt, Co, Fe, Mn, Cr, Ti and the like and a second layer of solder material obtained by selecting at least one species of element from the above-mentioned group of elements, a combination of the selected elements being different from that of the selected elements in the first layer of solder material. Specifically, the layered solder material is formed by contacting to each other the first layer of solder material, namely, solder material of Sn—Ag—Cu series or Sn—Sb series and the second layer of solder material, namely, solder material of Sn—Ag—Cu—Ni series or Sn—Pb series.

(ii) The layered solder material may be formed as rolled clad solder material by contacting the first layer of solder material and the second solder materials to each other by rolling.

(iii) For example, the rolled clad solder material contacted by rolling is used as the layered solder material for bonding different species of electrodes. The first layer of the layered solder material is attached to one electrode, namely, the Cu electrode while the second layer of the layered solder material is attached to the other electrode on which Ni/Au or Ag—Pd alloy is plated. In this condition, when soldering the Cu electrode and the electrode on which Ni/Au or Ag—Pd alloy is plated under predetermined conditions, a solid-phase diffusion layer is formed on a layered interface between the first and second layers of solder materials when soldering them. The intermediate solid-phase diffusion layer, the second layer of solder material and the first layer of solder material form barriers while the second layer of solder material forms the barrier against one electrode and the first layer of solder material forms the barrier against the other electrode. They can restrain any intermetallic compounds from being formed on the bonded interfaces based on the diffusion of metallic element(s) from one electrode to the other electrode. This allows two electrodes made of different species of materials to be soldered with high bonding reliability by restraining any intermetallic compounds from being formed on the bonded interface.

This invention is described as follows:

(1) A layered solder material for bonding different species of electrodes, the layered solder material being used for bonding a first electrode made of a first material and a second electrode made of a second material that is different from the first material, the layered solder material containing a first plate-like solder material and a second plate-like solder material, characterized in that the first and second plate-like solder materials are layered by a plane of the first plate-like solder material and a plane of the second plate-like solder material to have a two-layer structure, another plane of the first plate-like solder material that is different from the plane of the first plate-like solder material and another plane of the second plate-like solder material that is different from the plane of the second plate-like solder material are both bonded surfaces to the first electrode or the second electrode, and the first plate-like solder material and the second plate-like solder material have chemical compositions different from each other, wherein, when bonding the first plate-like solder material to the first electrode and bonding the second plate-like solder material to the second electrode, a solid-phase diffusion layer is formed within the first and second plate-like solder materials, and the first and second electrodes are soldered with the first plate-like solder material being attached to the first electrode and the second plate-like solder material being attached to the second electrode.

(2) The layered solder material for bonding different species of electrodes according to the above mentioned item (1), wherein the first plate-like solder material and the second plate-like solder material are rolled and contacted to each other so as to be a rolled clad solder material.

(3) The layered solder material for bonding different species of electrodes according to the above-mentioned item (1) or (2), wherein the first plate-like solder material is a solder material of Sn—Ag—Cu series or Sn—Sb series, and the second plate-like solder material is a solder material of Sn—Ag—Cu—Ni series or Sn—Pb series.

(4) A method of bonding the different species of electrodes in an electronic component, characterized in that when soldering a package having an electrode on which Ni/Au or Ag—Pd alloy is plated to a printed circuit board having a Cu electrode or an electrode on which Cu is plated, a solid-phase diffusion layer is formed within the inside of the layered solder material for bonding different species of electrodes according to any one of the above-mentioned items (1) through (3), and the first and second electrodes are soldered with the first plate-like solder material being attached to the first electrode and the second plate-like solder material being attached to the second electrode.

Effect of the Invention

According to this invention, two electrodes made of different species of materials, specifically, two species of electrodes on which different species of plating are performed, for example, an electrode on which Ni/Au or Ag—Pd alloy is plated and a Cu electrode, can be bonded with high bonding reliability by restraining any intermetallic compounds from being formed on the bonded interface.

Mode for Implementing the Invention

The following will describe mode for implementing this invention. In the following description, a case where a first plate-like solder material and a second plate-like solder material are rolled and contacted to each other so as to be a rolled clad solder material will be exemplified.

1. Layered Solder Material for bonding Different Species of Electrodes according to the Invention The layered solder material for bonding different species of electrodes is provided with the first and second plate-like solder materials. The first plate-like solder material and the second plate-like solder material have chemical compositions that are different from each other. For example, it is exemplified that the first plate-like solder material is a solder material of Sn—Ag—Cu series (for example, a solder material of Sn-3.0Ag-0.5Cu) or Sn—Sb series (for example, a solder material of Sn—5Sb) as well as the second plate-like solder material is a solder material of Sn—Ag—Cu—Ni series (for example, a solder material of Sn-2.0Ag-0.75Cu-0.07Ni) or Sn—Pb series (for example, a solder material of 87Pb-13Sn).

The layered solder material for bonding different species of electrodes is used for bonding a first electrode made of a first material and a second electrode made of a second material that is different from the first material. For example, it is exemplified that the first electrode is a Cu electrode and the second electrode is an electrode on which Ni/Au or Ag—Pd alloy is plated.

The layered solder material for bonding different species of electrodes is configured so that the first and second plate-like solder materials are layered by a plane of the first plate-like solder material and a plane of the second plate-like solder material joined to form a two-layer structure. The layered solder material for bonding different species of electrodes is the rolled clad solder material in which the first plate-like solder material and the second plate-like solder material are rolled and contacted to each other.

When the first plate-like solder material and the second plate-like solder material are rolled and contacted to each other so as to be a rolled clad solder material, the following factors (i) through (vii) required to be considered will be exemplified. It is desirable that the rolling is mainly carried out under the following described conditions.

(i) Rolling Speed: 2 through 60 m/min
(ii) Rolling Reduction {(Total Thickness of Plate before Rolling−Total Thickness of Plate after Rolling)/Total Thickness of Plate before Rolling}: 30 through 95%
(iii) Rolling Temperature: 5 through 30 degrees C.
(iv) Type of Rolling Machine: two-stage type through ten-stage type
(v) Thicknesses of First and Second Plate-like Solder Materials: both, 5 through 150
(vi) Thicknesses of Oxide Films on First and Second Plate-like Solder Materials: 50 nm or less
(vii) Dimensions and Shapes of First and Second Plate-like Solder Materials: (1.0 through 2.0) mm*(1.0 through 2.0) mm; and a round shape, a square, a rectangle or the like are suitably manufactured according to a shape of the electrode.

In addition, a clad condition may be suitably set according to two species of solder materials to be contacted, and it is not limited to any specifically fixed condition.

Moreover, another plane of the first plate-like solder material that is different from the plane of the first plate-like solder material and another plane of the second plate-like solder material that is different from the plane of the second plate-like solder material are both surfaces available to be bonded to the first electrode or the second electrode.

2. Method of Bonding the Different Species of Electrodes

A package having an electrode on which Ni/Au or Ag—Pd alloy is plated is bonded to a printed circuit board having a Cu electrode. For example, it is exemplified that such a method is used for bonding land grid array (LGA) package, land less chip carrier (LLCC) package, surface-mount-device (SMD) typed LED or the like.

By reflow-heating the layered solder material for bonding different species of electrodes according to the invention under, for example, a predetermined condition (heating and cooling processes under the predetermined condition), the solid-phase diffusion layer is formed on the layered surface of the layered solder material for bonding different species of electrodes. The solid-phase diffusion layer may be formed by pressurizing or applying ultrasonic vibration thereto, instead of the above-mentioned heating and cooling processes.

After thus forming the solid-phase diffusion layer, the first and second electrodes are soldered with a solder material of Sn—Ag—Cu series or Sn—Sb series, which is the first plate-like solder material, being attached to the Cu electrode, which is the first electrode of the printed circuit board, as well as a solder material of Sn—Ag—Cu—Ni series or Sn—Pb series, which is the second plate-like solder material, being attached to an electrode on which Ni/Au plating or Ag—Pd alloy is plated, which is the second electrode of the package.

This soldering is preferable to a reflow bonding. A heat condition in the reflow processing is preferable such that a temperature is identical to or is lower than a solidus temperature of plate-like solder material having lower solidus temperature between the first and second plate-like solder materials. Unless a period of reflow processing time is limited, it is possible to carry out a reflow processing at a temperature that is lower than the solidus temperature thereof by 60 degrees C. or more. However, when taking into consideration that this exerts any bad influence on the solderability thereof because of an advance of oxidation on the bonded surface, it is specifically preferable to do so at a temperature that is lower than the solidus temperature by about 10 through 50 degrees C. because its diffusion amount can be accurately controlled.

Since the first and second plate-like solder materials are mutually diffused completely by heating process so that species of the intermetallic compounds in the bonded interface of the electrode is increased, this is unfavorable because the serious problem may occur where the bonded electrodes are broken to lose a function of the electronic component by any impact load when, for example, accidentally dropping the electronic component. From these viewpoints, it is preferable that a heating peak temperature in the reflow processing is from a solidus temperature to a temperature that is lower than the solidus temperature by about 50 degrees C and a period of heating peak time is about 20 through 40 seconds.

Further, since the above-mentioned solid-phase diffusion layer may be formed within the inside of the layered solder material for bonding different species of electrodes in this invention, it is preferable that a reflow profile by which the solid-phase diffusion layer may be formed, namely, the reflow profile of one time including the above-mentioned heating and cooling is suitably set to perform the reflow bonding. This allows the solid-phase diffusion layer to be certainly formed on the bonded interface between the first and second plate-like solder materials and the surfaces thereof bonded with the each of the electrodes, so that it is possible to carry out the soldering with lower costs by the original solder compositions while the intermetallic compounds are restrained from being formed.

Further, by setting the chemical composition of the second plate-like solder material that is attached to the second electrode of the package on which Ni/Au is plated as to be 87Pb-13Sn in which Pb is enriched as well as by setting the chemical composition of the first plate-like solder material that is attached to the first electrode of the printed circuit board on which Cu is plated as to be Sn-5Sb in which Sn is enriched, the solid-phase diffusion layer restrains Cu contained in the first electrode of the printed circuit board from transferring to a side of the second electrode of the package.

In addition, it is not necessary to bond the first and second electrodes by one reflow processing. Due to the reason of bonding step, the layered solder material for bonding different species of electrodes may be bonded to only the first electrode of the printed circuit board to limit formation of the so-called bump and the first and second electrodes may be bonded after the formation of the bump.

EXECUTED EXAMPLE

The following will describe the invention more specifically with reference to the executed example.

In this executed example, Sn-5Sb solder material (its solidus temperature of 238 degrees C.) was used as the first plate-like solder material and 87Pb-13Sn solder material (its solidus temperature of 236 degrees C.) was used as the second plate-like solder material. The first plate-like solder material and the second plate-like solder material were put at a top of each other, rolled and contacted to each other so as to be a ribbon-like rolled clad solder material of 50 mm*500 mm. This rolled clad solder material was punched to obtain the layered solder material for bonding different species of electrodes with 1.5 mm*1.5 mm according to this invention. The rolled clad conditions were as follows:

(1) Rolling Speed: 25 m/min
(2) Rolling Reduction: 65%
(3) Rolling Temperature: room temperature
(4) Type of Rolling Machine: two-stage type
(5) Thicknesses of First and Second Plate-like Solder Materials: both, 60 μm
(6) Thicknesses of Oxide Films: 15 nm or less Flux was applied on the electrode (1.5 mm*1.5 mm), on which Cu was plated, of the printed circuit board. This layered solder material for bonding different species of electrodes was then mounted on the electrode on which the Cu was plated with a side of the first plate-like solder material thereof being attached to this electrode. Further, the package having the electrode on which Ni/Au was plated was mounted thereon.

Reflow processing was performed on such an electronic device under a predetermined condition. The heating peak temperature in the reflow processing including the heating process and the cooling process was set to be 190 degrees C. and the period of heating peak time was set to be 20 seconds.

Thus, when the solid-phase diffusion layer thus formed between the first and second plate-like solder materials became barrier so that two electrodes made of different species of materials, specifically, two species of electrodes on which different species of plating were performed, for example, the electrode on which Ni/Au or Ag—Pd alloy is plated and the Cu electrode, are soldered, it is possible to solder them with high bonding reliability restraining any intermetallic compounds from being formed on these bonded interfaces.

Moreover, since effects of this invention is obtained when forming the above-mentioned solid-phase diffusion layer within the inside of the layered solder material for bonding different species of electrodes, any kinds of combinations other than the above-mentioned combination of two electrodes and the first and second plate-like solder materials are available.

As described above, according to this invention, even when the first and second electrodes on which different species of plating are performed, for example, the first electrode which is the Cu electrode and the second electrode on which Ni/Au or Ag—Pd alloy is plated are soldered, it is possible to solder them with high bonding reliability by restraining any intermetallic compounds from being formed on these bonded interfaces.

The invention claimed is:

1. A layered solder material for bonding different species of electrodes, the layered solder material being used for bonding a first electrode made of a first material and a second electrode made of a second material that is different from the first material, the layered solder material containing a first plate-like solder material of Sn—Ag—Cu series or Sn—Sb series and a second plate-like solder material of Sn—Ag—Cu—Ni series or Sn—Pb series, characterized in that the first and second plate-like solder materials are layered, with a first plane of the first plate-like solder material and a first plane of the second plate-like solder material being joined together as a two-layer structure,
   a surface of another plane of the first plate-like solder material that is different from the first plane of the first plate-like solder material and a surface of another plane of the second plate-like solder material that is different from the first plane of the second plate-like solder material are both available to be bonded to the first electrode or the second electrode, and
   wherein the first plate-like solder material and the second plate-like solder material have chemical compositions that are different from each other, and
   wherein, when bonding the first plate-like solder material to the first electrode and bonding the second plate-like solder material to the second electrode, a solid-phase diffusion layer is formed within the first and second plate-like solder materials, and whereby
   the first and second electrodes can be soldered with the first plate-like solder material being attached to the first electrode and the second plate-like solder material being attached to the second electrode.

2. The layered solder material for bonding different species of electrodes according to claim 1, wherein the first plate-like solder material and the second plate-like solder material are rolled and contacted to each other so as to be a rolled clad solder material.

3. The layered solder material for bonding different species of electrodes according to claim 1, wherein the first electrode is a Cu electrode or an electrode on which Cu is plated, and the second electrode is an electrode on which Ni is plated and on which Au is plated over the Ni, or on which Ag—Pd alloy is plated.

4. The layered solder material for bonding different species of electrodes according to claim 2, wherein the first electrode is a Cu electrode or an electrode on which Cu is plated, and the second electrode is an electrode on which Ni is plated and on which Au is plated over the Ni, or on which Ag—Pd alloy is plated.

5. A method of bonding the different species of electrodes in an electronic component, when soldering a package having a second electrode, on which Ni is plated and on which Au is plated over the Ni, or on which Ag—Pd alloy is plated, to a printed circuit board having a first electrode of Cu or on which Cu is plated, comprising:
   providing a quantity of a layered solder material for bonding different species of electrodes according to claim 1;
   forming a solid-phase diffusion layer within the inside of the layered solder material for bonding different species of electrodes according to claim 1; and soldering the first and second electrodes with the first plate-like solder material being attached to the first electrode and the second plate-like solder material being attached to the second electrode.

6. A method of bonding the different species of electrodes in an electronic component, when soldering a package having a second electrode on which Ni is plated and on which Au is plated over the Ni, or on which Ag—Pd alloy is plated, to a printed circuit board having a first electrode of Cu or on which Cu is plated, comprising:
providing a quantity of a layered solder material for bonding different species of electrodes according to claim 2;
forming a solid-phase diffusion layer within the inside of the layered solder material for bonding different species of electrodes according to claim 2; and
soldering the first and second electrodes with the first plate-like solder material being attached to the first electrode and the second plate-like solder material being attached to the second electrode.

7. The layered solder material for bonding different species of electrodes according to claim 1, wherein the first plate-like solder material comprises at least one element selected from the group of elements consisting of Sn, Ag, Cu, Ni, Sb, Bi, Ge, Al, Ga, In, Zn, Au, Pd, Pt, Co, Fe, Mn, Cr, Ti, and wherein
the second plate-like solder material comprises at least one element selected from the same group of elements, a combination of the selected elements in the second plate-like solder material being different from that a combination of the selected elements in the first plate-like solder material.

8. The layered solder material for bonding different species of electrodes according to claim 2, wherein the first plate-like solder material comprises at least one element selected from a group of elements consisting of Sn, Ag, Cu, Ni, Sb, Bi, Ge, Al, Ga, In, Zn, Au, Pd, Pt, Co, Fe, Mn, Cr, Ti, and wherein
the second plate-like solder material comprises at least one element selected from the same group of elements, a combination of the selected elements in the second plate-like solder material being different from a combination of the selected elements in the first plate-like solder material.

9. A method of bonding the different species of electrodes in an electronic component for bonding a first electrode made of Cu or on which Cu is plated and a second electrode on which Ni is plated and on which Au is plated over the Ni, or on which or Ag—Pd alloy is plated, by using a layered solder material in which a first plate-like solder material and a second plate-like solder material having a chemical composition different from that of the first plate-like solder material are layered, the method comprising:
selecting at least one element from a group of elements consisting of Sn, Ag, Cu, Ni, Sb, Bi, Ge, Al, Ga, In, Zn, Au, Pd, Pt, Pb, Co, Fe, Mn, Cr and Ti as the first plate-like solder material, and selecting at least one element from the same group of elements as the second plate-like solder material, the composition of the selected elements in the second plate-like solder being different from the composition of the selected elements in the first plate-like solder material,
layering the first and second plate-like solder materials by joining a first plane of the first plate-like solder material and a first plane of the second plate-like solder material to form a two-layer structure,
while a surface of another plane of the first plate-like solder material that is different from the first plane of the first plate-like solder material is set to be bonded to the first electrode and a surface of another plane of the second plate-like solder material that is different from the first plane of the second plate-like solder material is set to be bonded to the second electrode, heating the first and second plate-like solder materials to a temperature that is identical to or is lower than a solidus temperature of the one of the first and second plate-like solder materials having a lower solidus temperature, with the first plate-like solder material being attached to the first electrode and the second plate-like solder material being attached to the second electrode when bonding the first plate-like solder material to the first electrode and bonding the second plate-like solder material to the second electrode, thereby forming a solid-phase diffusion layer within a lamination plane joining the first and second plate-like solder materials, and
thereby forming a diffusion barrier protecting the second electrode bonded to the second plate-like solder material, and
forming a diffusion barrier protecting the first electrode bonded to the first plate-like solder material.

10. The method of bonding the different species of electrodes in an electronic component according to claim 9, wherein the step of layering the first plate-like solder material and the second plate-like solder material includes rolling the first and second plate-like solder materials in contact with each other so as to be a rolled clad solder material.

\* \* \* \* \*

UNITED STATES PATENT AND TRADEMARK OFFICE
CERTIFICATE OF CORRECTION

| | |
|---|---|
| PATENT NO. | : 9,669,493 B2 |
| APPLICATION NO. | : 14/648031 |
| DATED | : June 6, 2017 |
| INVENTOR(S) | : Watanabe et al. |

Page 1 of 1

It is certified that error appears in the above-identified patent and that said Letters Patent is hereby corrected as shown below:

In the Claims

In Column 9, Line 30, the word "that" should be deleted.

Signed and Sealed this
First Day of August, 2017

Joseph Matal
*Performing the Functions and Duties of the*
*Under Secretary of Commerce for Intellectual Property and*
*Director of the United States Patent and Trademark Office*